US 6,519,159 B1

(12) United States Patent
Weinmeier et al.

(10) Patent No.: US 6,519,159 B1
(45) Date of Patent: Feb. 11, 2003

(54) ELECTRONIC DEVICE

(75) Inventors: Harald Weinmeier, Vienna (AT); Erich Halbreiner, Vienna (AT)

(73) Assignee: Siemens AG Osterreich, Vienna (AT)

( * ) Notice: Subject to any disclaimer, the term of this patent is extended or adjusted under 35 U.S.C. 154(b) by 165 days.

(21) Appl. No.: 09/645,676

(22) Filed: Aug. 24, 2000

Related U.S. Application Data

(63) Continuation of application No. PCT/AT99/00035, filed on Feb. 10, 1999.

(30) Foreign Application Priority Data

Feb. 24, 1998 (AT) .................................................. 332/98

(51) Int. Cl.[7] .............................. H05K 5/02; H05K 7/20
(52) U.S. Cl. ....................... 361/740; 361/688; 361/704; 361/736; 361/756
(58) Field of Search ................................. 361/679, 684, 361/688, 690, 704, 707, 724, 728, 736, 740, 741, 747, 748, 756

(56) References Cited

U.S. PATENT DOCUMENTS

| 4,502,098 A | * | 2/1985 | Brown et al. ................ 361/690 |
| 4,780,095 A | * | 10/1988 | Classon et al. .............. 439/637 |
| 5,102,342 A | * | 4/1992 | Marian ........................ 439/260 |
| 5,871,362 A | * | 2/1999 | Campbell et al. .............. 439/67 |
| 6,273,181 B1 | * | 8/2001 | Matsui et al. ................ 165/185 |
| 6,341,066 B1 | * | 1/2002 | Murowaki et al. .......... 257/723 |

FOREIGN PATENT DOCUMENTS

| DE | 3835178 A1 | * | 4/1990 | ............ H05K/5/02 |
| DE | 4422114 A1 | * | 1/1996 | ............ H05K/7/20 |
| EP | 0793407 A2 | * | 9/1997 | ............ H05K/7/20 |

* cited by examiner

Primary Examiner—Anatoly Vortman
(74) Attorney, Agent, or Firm—Thomas R. Vigil; Welsh & Katz, Ltd.

(57) ABSTRACT

Electronic device with a housing 1, a rear wall 7 and, accommodated in the housing, at least one printed circuit board 10 which stands essentially perpendicular to the rear wall, wherein the rear wall 7 is a part independent of the housing 1, which closes off the interior of the housing to the rear, and the printed circuit board 10 is connected in a bearing manner to the rear wall by holding means 13, 15 protruding from this and engaging with the printed circuit board.

12 Claims, 3 Drawing Sheets

ELECTRONIC DEVICE

CROSS-REFERENCE TO RELATED APPLICATIONS

This application is a Continuing Application of PCT Application No. PCT/AT99/00035 filed Feb. 10, 1999 which claims priority from Austrian Application No. A 332/98 filed Feb. 24, 1998.

BACKGROUND OF THE INVENTION

1. Field of the Invention

The invention relates to an electronic device with a housing, a rear wall and, accommodated in the housing, at least one printed circuit board which stands essentially perpendicular to the rear wall.

2. Description of the Prior Art

Devices of this kind are known in many embodiments, but the requirements specified are essentially the same. In particular, the assembly of the device should be rapid and if possible should be achievable without ancillary resources; devices connected to the mains power supply should be touch-protected; and aesthetic design of the housing should be possible. Electronic devices generally also contain power semiconductors which must be cooled. The semiconductors are connected electrically to the printed circuit board and are in mechanical or thermal contact with a cooling element or a relatively large metal cooling surface.

For example, a synthetic material housing is known wherein the rear wall, the two side walls and the upper and lower wall are designed in one piece and wherein the synthetic material housing comprises a front wall which covers at the front the printed circuit board and its components which have been inserted into the housing. In order to cool certain components, cooling fins are fitted to the printed circuit board, which leads to considerable expenditure in terms of mechanical and production technology. The power semiconductors are, on one side, soldered to the printed circuit board and on the other side, mechanically held onto the cooling fins with the assistance of clips. However, this means that the cooling fins must be connected rigidly in a mechanical manner to the printed circuit board, otherwise the soldered joints of the power semiconductors and their connections may be damaged during the course of time and under adverse conditions. In the case of devices which are to be mounted on standard mounting rails, there is an additional requirement that the device should be suspended with its rear wall on a rail and the corresponding introduction of forces must be taken into account.

DE 44 22 114 A1 describes a housing pot for electronic modules, e.g. in motor vehicles. The housing pot is designed to be open at one side; it is sealed with a separate cover which is firmly connected to the printed circuit board. Heat is conducted away from the power components by means of a screw fastening of the housing pot with a cooling element, which is designed in one piece with the cover. In accordance with its specifications, this housing is attached to the housing pot via the air-duct fastening, for which reason, the choice of this housing wall as the wall which bears the printed circuit board and closes off the interior of the housing does not seem expedient. Furthermore, the realization of the connection between the cover and the printed circuit board as a fixed connection in the manner of a screw connection or similar is a disadvantage. In an electronic device publicized in EP 0 793 407 A2, the single circuit board forms one housing wall and is fitted with cooling ribs on its exterior side for the removal of heat. The printed circuit board in this case is borne mechanically by the housing, which has a synthetic material plinth with downward-protruding, flat plugs. This prior art solution is indeed suitable for small, compact devices, namely, as listed in the document, for electronic relays for plug-in assembly in motor vehicles.

By contrast, the object of the invention is to create an electronic device of the type provided above, wherein at least one printed circuit board stands essentially perpendicular to the rear wall, wherein it is possible to achieve adequate mechanical strength, and whilst taking safety requirements into account to achieve favorably priced assembly.

SUMMARY OF THE INVENTION

In accordance with the invention, this object is resolved with a device of the kind named above in that the rear wall is a part which is independent of the housing, is in thermal contract with components to be cooled and closes off the interior of the housing to the rear, and wherein the printed circuit board is connected to the rear wall in a bearing manner by holding means protruding from the rear wall and engaging with the printed circuit board.

The initial result of the measure according to the invention is that the printed circuit board is borne mechanically by the rear wall, which also has a favorable effect when mounting on mounting rails, wherein, if required, the printed circuit board can still be supported by the remainder of the housing which is subsequently fitted. One particular advantage in this case results from the fact that semiconductors arranged on the printed circuit board can now be cooled with the assistance of the rear wall or parts of the rear wall, because mechanically the rear wall forms a unit with one or more printed circuit boards which protrude perpendicularly from it.

The printed circuit board can be attached inexpensively and reliably to the rear wall if the bores of the holding means in the printed circuit board contain penetrating and clinch-connectable webs.

Assembly is rendered simpler if the bores of the holding means in the printed circuit board contain allocated alignment pins.

If the rear wall consists of an outer plate and an inner plate, wherein the inner plate comprises regions which are located at a distance from the outer plate from which the holding means protrude, a particular flexibility in cooling the components and also an improved cooling effect can be achieved because air circulates around both sides of the protruding regions. In this context, it is expedient if the inner plate is partially in contact with the outer plate and has regions essentially parallel to the outer plate and running at a distance from the outer plate. In this case, it is preferable with regard to cooling if at least the inner plate is made of metal.

With reference to cost-favorable production, it is advisable if the inner plate is riveted or Tox-clinched to the outer plate.

The rear wall may have hook elements on its outer side for suspension onto a mounting rail, which, especially in the case of a metal rear wall, proves to be a simple embodiment. In this case, the rear wall below the hook element can have at least one releasable retaining element engaging with the mounting rail.

With one simple and expedient variant of the invention, it is possible for the cooling elements to be in contact with the inner plate of the rear wall, wherein, in this case, the inner plate can be connected directly to the printed circuit board, which produces mechanical advantages in many cases, because a connection between the rear wall and the printed circuit board need not be made completely at the edge of the printed circuit board.

One variant which meets the demand for inexpensive assembly is characterized in that the components to be cooled are pressed with the assistance of U-shaped holding springs against the rear wall or its inner plate, wherein the feet of the holding springs penetrate apertures in the rear wall and their web-parts are in contact with the component.

To simplify assembly, it is preferable if the front wall, the side walls and the upper and lower wall of the housing are designed in one piece and if the housing is made of a synthetic material.

The invention and its further advantages are explained below with reference to exemplified embodiments illustrated in the attached diagram.

BRIEF DESCRIPTION OF THE DRAWINGS

FIG. 2a shows a detail from FIG. 2 in an enlarged scale.

DESCRIPTION OF THE PREFERRED EMBODIMENT(S)

Figure 1:
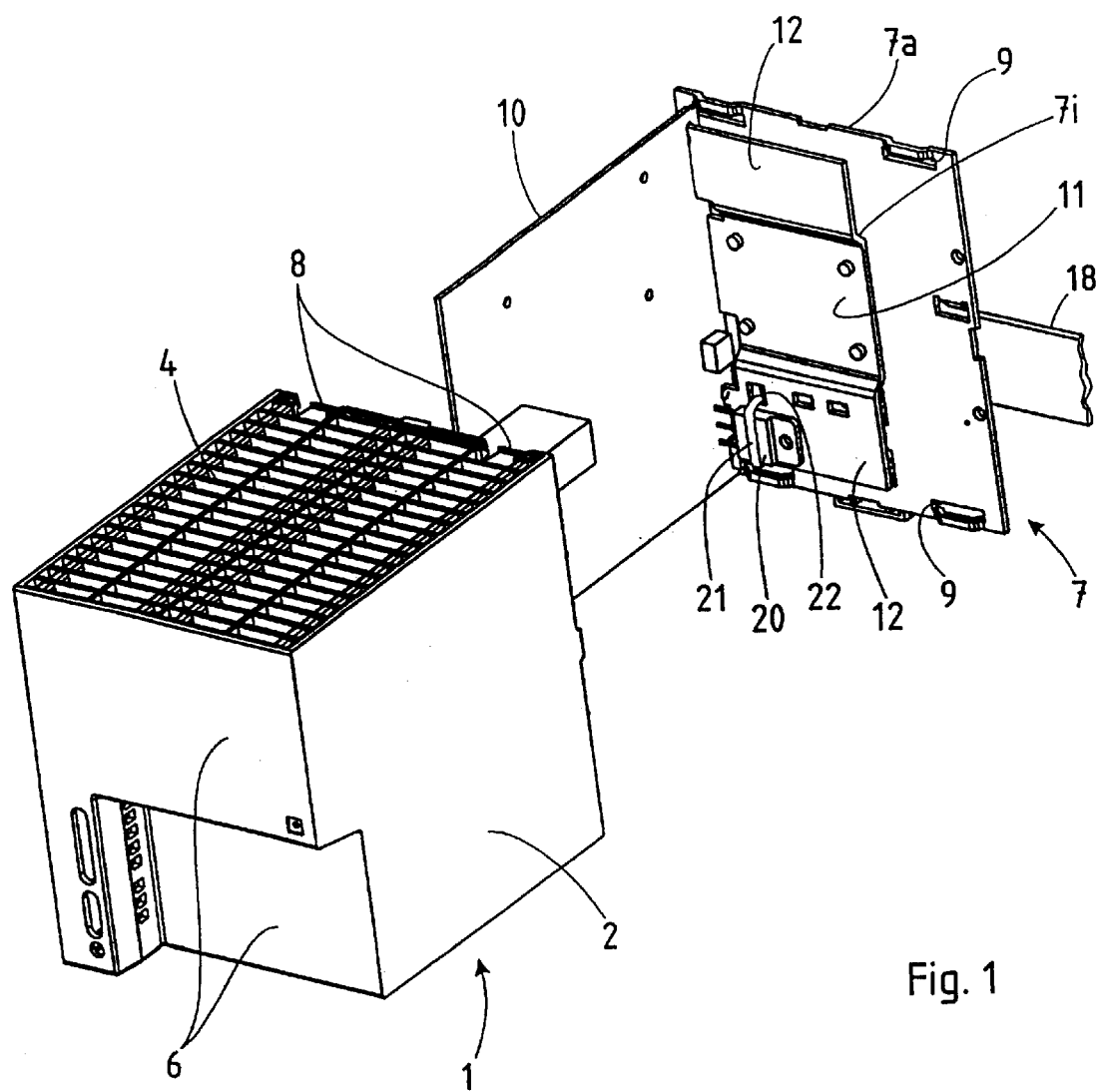
FIG. 1 shows a device according to the invention, partly dismantled, in perspective view from the front, above and the right.

In accordance with the diagrams, a housing 1 for an electronic device comprises a right side wall 1, a left side wall 3, an upper wall 4 a lower wall 5 and a front wall 6, all of these walls being made in one piece from a synthetic material. As the diagram illustrates, the upper wall 4 and the lower wall 5 are designed with apertures in the form of a grating so that a stream of air can pass through the interior of the housing from above to below.

The housing 1 is provided with a rear wall 7 which, in the assembled condition of the device, closes off the interior of the housing to the rear. In order to connect the rear wall 7 mechanically to the housing 1, four resilient hook latches 8 protrude from the rear edges of the housing; these hook latches can penetrate apertures 9 in the rear wall 7 and can interlock with this rear wall.

Figure 2:
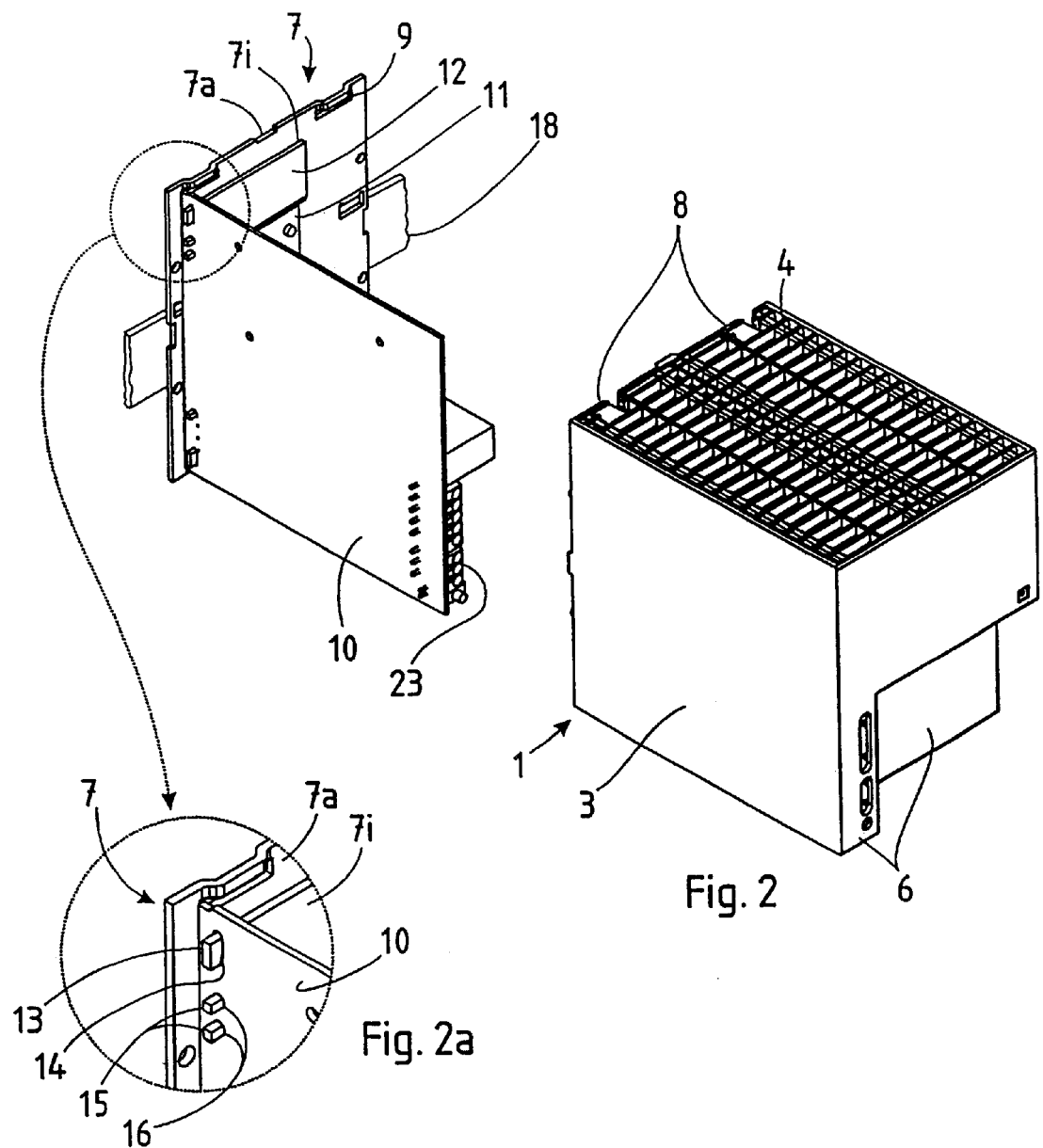
FIG. 2 shows the same device in a perspective view from the front, above and the left.

The device according to the invention comprises a printed circuit board 10, which in the present case is mounted perpendicularly at the left side of the device and is connected mechanically to the rearwall, as will be explained in greater detail below. The rear wall 7 consists of an essentially flat outer plate 7a and an inner plate 7i, wherein the inner plate 7i comprises a flat central region 11 which is in contact with the outer plate 7a. In the present case, this central region 11 is connected to the outer plate 7a by Tox-clinching connection, a form of riveting without using additional material. The inner plate 7i, like the outer plate 7a, consists of metal, for example aluminum. However, primarily the outer plate 7a may also consist of another material such as a synthetic material. From the two side regions 12 of the inner plate 7i, webs 13 protrude, which penetrate rectangular recesses 14 in the printed circuit board 10 and are then clinch-connected. This is illustrated in detail in FIG. 2a which also shows that alignment pins protruding from the side regions 12 of the inner plate 7i engage in bores 16 or otherwise penetrate the printed circuit board.

Figure 3:
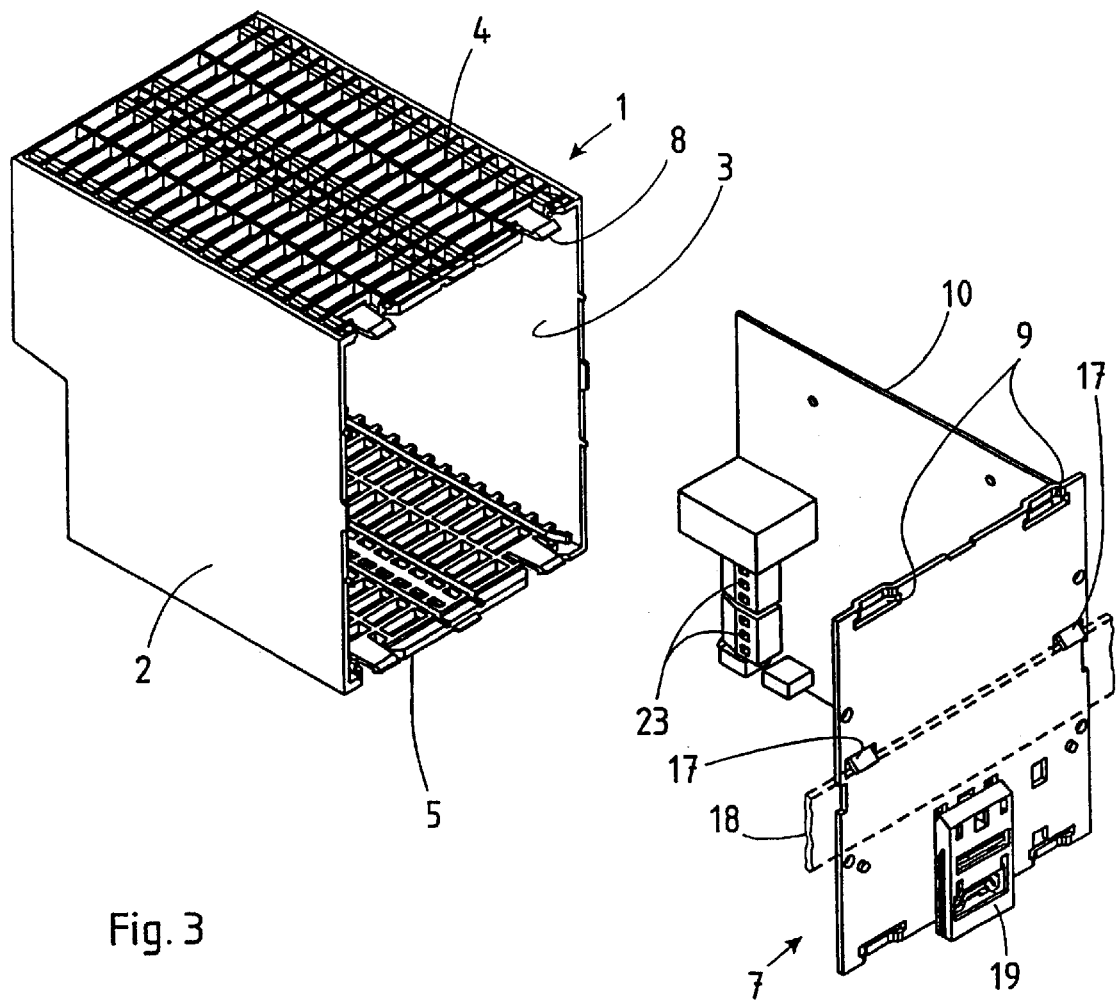
FIG. 3 shows the exemplified embodiment of the invention illustrated in FIGS. 1 and 2 in a perspective view from the rear, right and above.

From the above explanation, it is evident that the printed circuit board 10 is connected in a mechanically stable manner with the assistance of the webs 13 and the alignment pins 15 to the rear wall 7, namely to its inner plate 7i, so that the printed circuit board 7 can be borne by the rear wall. This is relevant to the extent that in the case of the present exemplified embodiment, at the outer side of the rear wall 7, hook elements 17 are provided in each case in the form of punched and folded latches, with the assistance of which the rear wall 7 and therefore also the entire device can be suspended on a mounting rail 18, which is shown in the diagram, with particular reference to FIG. 3. The rear wall 7 and with it the device can be secured on the mounting rail 18 with the assistance of a retaining element 19, wherein in the present case, the retaining element is designed as a resilient retaining slide, which must be pulled downwards in order to release it.

Since they are not required for the explanation of the invention, most of the components normally found on the printed circuit board 10 have been omitted. FIG. 1 in particular illustrates a component 20, which represents a power transistor, soldered by its contacts to the printed circuit board 10, with its housing in contact with the side region 12 of the inner plate 7i. In order to guarantee a good thermal contact, the component 20 is pressed against the side region 12 with a familiar U-shaped holding spring 21, wherein the feet of the holding spring penetrate apertures 22 and its web-part is in contact with the component 20.

In the exemplified embodiment illustrated, the rear wall 7 is designed in two parts, i.e. it consists of an outer plate 7a and an inner plate 7i. However, it is also possible to use a continuous rear wall, i.e. in practice, only the outer plate 7a without the inner plate 7i, wherein the necessary webs or alignment pins can be folded by appropriate punching and bending processes so far from the rear wall 7 that a reliable connection with the printed circuit board 10 is possible. Moreover, the two-part design of the rear wall 7 illustrated in the exemplified embodiment also provides the advantage that the side regions 12 are exposed on both sides, and that cooling air can therefore circulate around them. However, the design of the rear wall 7 is hardly subject to limitations, wherein it is possible, for example, to fold a rear wall from a single sheet of metal in a meandering manner, thereby not merely producing partial regions projecting into the interior and suitable for fastening, but also maximizing the total surface area in order to improve cooling.

To assemble the device, the rear wall is inserted with the webs 13 and the alignment pins 15 into the printed circuit board 10, and then the webs 13 are clinch-connected thereby establishing the required mechanical connection between the printed circuit board 10 and the rear wall 7. Following this, the component 20 to be cooled, which is already in electrical contact with the printed circuit board 10, is fitted to the rear wall with the assistance of the holding spring 21, and the fitted printed circuit board 10 is inserted together with the rear wall 7 into the housing 1. Terminal clips 23—illustrated in FIG. 3—are also fitted to the printed circuit board and can then be operated through the front wall 6, as shown in FIG. 1.

The rear wall 7 fulfils a number of functions, namely, the possibility of mounting on a mounting rail 18, the action as a cooling element, the rigid connection with the printed circuit board 10, touch-protection from the rear of the device and the transfer of the weight of the printed circuit board 10 to the mounting rail 18. Moreover, the rear wall serves as a carrier for the U-shaped holding spring 21 for the component 20 to be cooled. It is evident that, in general, rather than merely one power transistor, several electronic components must be cooled, and that these are arranged in a similar manner to the single component 20 in the exemplified embodiment illustrated.

By contract with known devices—in which the housing is held on the holding rail in such a manner that after removing the front wall, the printed circuit board with its components can be removed from the front—the rear wall in the case of the invention is suspended on the mounting rail 18, and after removal of the housing 1 from the front, the actual electronic device remains on the mounting rail, but now without the housing. This may also be advantageous for maintenance in many cases. In the state of the art device, the bearing function is always assumed by the housing, whereas, in the case of the invention, the rear wall bears the printed circuit board or indeed several printed circuit boards. The number of parts to be assembled is also reduced with the invention, because, in the case of the state of the art, the printed circuit board with cooling elements, the housing and a front wall are all present, but with the invention only two parts are present, namely, the housing and the rear wall together with the printed circuit board.

We claim:

1. Electronic device with a housing (1), a rear wall (7) and accommodated in the housing at least one printed circuit board (10) which stands essentially perpendicular to the rear wall, characterized in that the rear wall (7) is a part independent of the housing (1), with which components (20) to be cooled are in thermal contact and which part closes off the interior of the housing to the rear and wherein the printed circuit board (10) is connected in a bearing manner to the rear wall (7) by holding means (13, 15) protruding from the rear wall (7) and engaging with the printed circuit board (10), and the rear wall (7) having at least two hook elements on its outer side for suspension on a mounting rail and at least one releasable retaining element (19) below the hook elements (17) which engages with the mounting rail.

2. The device of claim 1, characterized in that the holding means comprise webs (13) which penetrate recesses (14) of the printed circuit board (10) and are capable of being clinch-connected.

3. The device of claim 1, characterized in that the holding means comprise alignment pins (15) allocated to bores (16) of the printed circuit board (10).

4. The device of claim 1, characterized in that the rear wall (7) comprises an outer plate (7z) and an inner plate (7i), wherein the inner plate comprises regions (12) which are at a distance from the outer plate and from which the holding means (13, 15) protrude.

5. The device of claim 4, characterized in that the inner plate (7i) is partially in contact with the outer plate (7a) and has regions (12) running essentially parallel to and at a distance from the outer plate.

6. The device of claim 5, characterized in that at least the inner plate (7i) consists of metal.

7. The device of claim 4, characterized in that the inner plate (7i) is made of metal.

8. The device of claim 2, characterized in that components (20) to be cooled are in contact with the inner plate (7i) of the rear wall (7).

9. The device of claim 1, characterized in that the housing (1) is made of synthetic material.

10. Electronic device with a housing (1), a rear wall (7) and accommodated in the housing at least one printed circuit board (10) which stands essentially perpendicular to the rear wall, characterized in that the rear wall (7) is a part independent of the housing (1), with which components (20) to be cooled are in thermal contact and which part closes off the interior of the housing to the rear and wherein the printed circuit board (10) is connected in a bearing manner to the rear wall (7) by holding means (13, 15) protruding from the rear wall (7) and engaging with the printed circuit board (10) and the components (20) to be cooled being pressed with the assistance of U-shaped holding springs (21) against the rear wall (7) or its inner plate (7i), wherein the feet of the holding springs penetrate apertures (22) of the rear wall (7) and their web-parts are in contact with the component.

11. The device of claim 10, characterized in that the holding means comprise webs (13) which penetrate recesses (14) of the printed circuit board (10) and are capable of being clinch-connected.

12. The device of claim 10, characterized in that the holding means comprise alignment pins (15) allocated to bores (16) of the printed circuit board (10).

* * * * *